United States Patent
Lee

(10) Patent No.: US 6,190,924 B1
(45) Date of Patent: Feb. 20, 2001

(54) APPARATUS AND METHOD TO FORM FERROELECTRIC CAPACITORS HAVING LOW DIELECTRIC LOSS

(75) Inventor: Seok Won Lee, Ichonshi (KR)

(73) Assignee: Hyundai Electronics Industries Co., Ltd. (KR)

( * ) Notice: Under 35 U.S.C. 154(b), the term of this patent shall be extended for 0 days.

(21) Appl. No.: 09/224,654

(22) Filed: Dec. 30, 1998

(51) Int. Cl.[7] .................................................. H01L 21/00
(52) U.S. Cl. ............................. 438/3; 438/240; 438/396; 438/253
(58) Field of Search ............................. 438/3, 240, 253, 438/396

(56) References Cited

U.S. PATENT DOCUMENTS

| 5,426,075 | 6/1995 | Perino et al. . |
| 5,519,566 | 5/1996 | Perino et al. . |
| 5,566,046 | 10/1996 | Kulwicki . |
| 5,614,018 | 3/1997 | Azuma et al. . |
| 5,650,646 | 7/1997 | Summerfelt . |
| 5,757,061 | 5/1998 | Satoh et al. . |
| 6,033,920 | * 3/2000 | Shimada et al. ................. 438/240 |

FOREIGN PATENT DOCUMENTS

| 9-260516 | 3/1996 | (JP) . |
| 9-36309 | 2/1997 | (JP) . |
| 9-142844 | 3/1997 | (JP) . |
| 9-186376 | 7/1997 | (JP) . |

\* cited by examiner

*Primary Examiner*—Charles Bowers
*Assistant Examiner*—Yennhu B. Huynh
(74) *Attorney, Agent, or Firm*—Blakely Sokoloff Taylor & Zafman

(57) ABSTRACT

There is provided a method for fabricating a ferroelectric capacitor which comprises the steps of: forming a bottom electrode over a substrate on which a predetermined lower structure is formed; forming a thin film of polycrystalline strontium bismuth tantalate (SBT) over the entire structure; forming an amorphous thin film of SBT on the polycrystalline film of SBT; and forming an upper electrode on the amorphous film of SBT. Though the amorphous thin film of SBT is lower in dielectric constant than the polycrystalline thin film of SBT so as not to have the properties of ferroelectric, it does not have crystalline grain boundary and, thus, does not form the path for transferring material. Therefore, the amorphous thin film of SBT can block the path of leakage current. It also results in complement of bismuth lost in the processes of deposition and thermal treatment for crystallization of the ferroelectric film of SBT at a high temperature.

11 Claims, 1 Drawing Sheet

APPARATUS AND METHOD TO FORM FERROELECTRIC CAPACITORS HAVING LOW DIELECTRIC LOSS

FIELD OF THE INVENTION

The present invention relates to methods for forming semiconductor devices; and, more particularly, to methods for forming ferroelectric capacitors applied to ferroelectric random access memory (FeRAM) as a non-volatile memory element and highly integrated post-generation Dynamic RAM (DRAM) using a thin film of strontium bismuth tantalate (SBT) as a ferroelectric film.

DESCRIPTION OF THE PRIOR ART

The operation property such as refresh property of semiconductor has been considered as a primary thing in pursuit of high integration of semiconductor memory devices such as DRAM. Therefore, in order to obtain suitable operation properties, various researches and developments have been made on the technology for obtaining sufficient static capacitance of capacitors.

The materials such as strontium bismuth tantalate (SBT) and $Pb_xZr_{1-y}Ti_yO_3$ (PZT) have been considered as ferroelectric materials of capacitors in FeRAM as non-volatile memory elements and lately post-generation semiconductor memory devices.

FIG. 1 among the appended drawings is a section view of the ferroelectric capacitor fabricated according to the prior art using SBT as the material of ferroelectric layer.

As shown in FIG. 1, when the ferroelectric capacitor 15 is fabricated using a SBT thin film 11 as a ferroelectric layer over substrate 10, the SBT thin film 11 is formed and crystallized by the processes of deposition and post thermal treatment at a high temperature of 800° C. in order to obtain better ferroelectric properties. In the drawing, the reference number 10 represents a substrate, 12 represents a bottom electrode and 13 represents an upper electrode, respectively.

The crystallization process is necessary since the SBT thin film 11 can possess suitable ferroelectric properties such as high dielectric constant and remanent polarization in the state of polycrystalline. However, the crystalline grain boundaries in the polycrystalline of the SBT thin film 11 provide conductive paths of leakage current.

Therefore, there is a drawback that the grain boundaries result in dielectric loss due to leakage current, and thus deteriorate the properties of the ferroelectric capacitors.

Various methods such as using various electrodes and adding dopants have been tried in order to decrease such leakage current. However, these methods are not satisfactory.

There is also another drawback that in the process of thermal treatment for crystallization at high temperature, Bi is evaporated at the surface of the SBT thin film 11 to change the composition of the ferroelectric material, and deteriorating the properties of the ferroelectric.

Accordingly, the other methods of ferroelectric capacitors are required in order to decrease leakage current without sacrificing good properties of polycrystalline.

SUMMARY OF THE INVENTION

It is, therefore, an object of the present invention to provide a method for fabricating a ferroelectric capacitor without the dielectric loss due to leakage current or with the decreased dielectric loss.

In accordance with an embodiment of the present invention, there is provided a method for fabricating a ferroelectric capacitor which comprises the steps of: forming a bottom electrode over a substrate on which a predetermined lower structure is formed; forming a thin film of polycrystalline strontium bismuth tantalate (SBT) over the entire structure; forming an amorphous thin film of SBT on the polycrystalline film of SBT; and forming an upper electrode on the amorphous film of SBT.

The present invention is directed to a technology by which an amorphous thin film of SBT containing excess bismuth is thinly formed between the upper electrode of the ferroelectric capacitor and the polycrystalline thin film of SBT. Though the amorphous thin film of SBT is lower in dielectric constant than the polycrystalline thin film of SBT so as not to have the properties of ferroelectric, it does not have crystalline grain boundary and thus does not form the path for transferring material. Therefore, it can block the path of leakage current. The amorphous thin film is not required too thick for obtaining this effect and thus, it does not mostly affect the deterioration of the ferroelectric properties such as the decrease of dielectric constant. It also results in the complement of bismuth lost in the processes of deposition and thermal treatment for crystallization of the ferroelectric film of SBT at a high temperature.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

The invention will be illustrated in detail by the following preferred embodiment with reference to the accompanying drawings.

Figure 1:
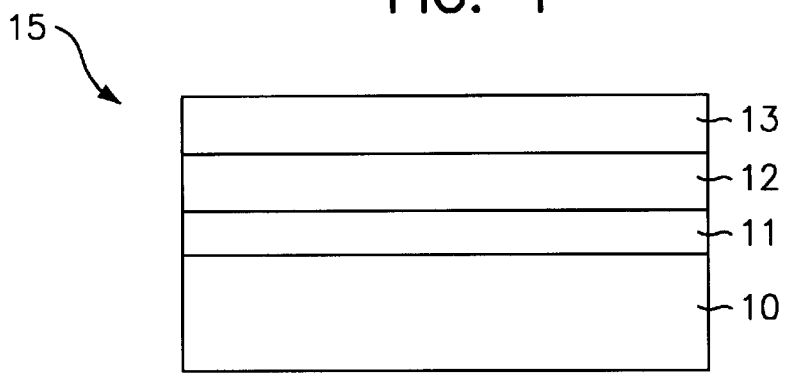
FIG. 1 is a section view of the ferroelectric capacitor fabricated according to the prior art.
Figure 2:
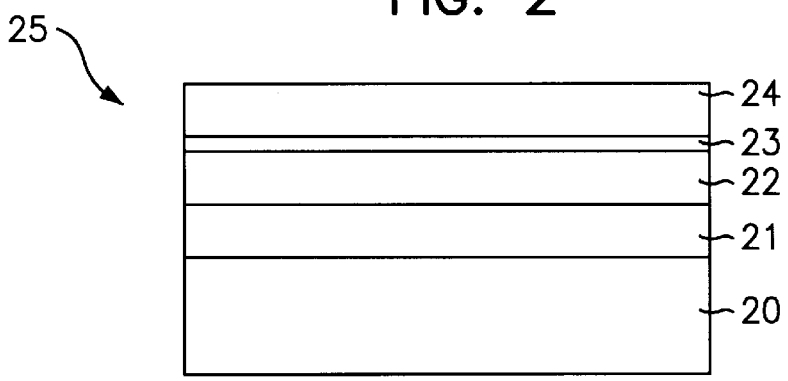
FIG. 2 is a section view of the ferroelectric capacitor fabricated according to an embodiment of the present invention.
Figure 3:
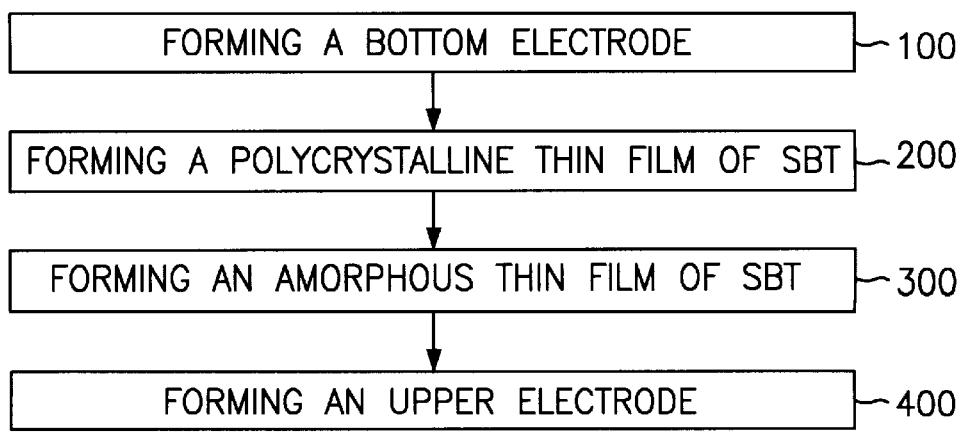
FIG. 3 is a flow chart showing the processes for fabricating a ferroelectric capacitor according to an embodiment of the present invention.

FIG. 2 is a section view of a ferroelectric capacitor 25 fabricated according to an embodiment of the present invention, wherein the reference number 20 represents a substrate, 22 a polycrystalline thin film of SBT, 23 an amorphous thin film of SBT and 24 an upper electrode, respectively. FIG. 3 is a flow chart of the processes for fabricating the ferroelectric capacitor 25 according to an embodiment of the present invention. Hereinafter, an embodiment of the present invention is illustrated using the reference numerals of FIGS. 2 and 3.

First, a bottom electrode 21 is formed over a substrate 20 on which a predetermined lower structure is formed (step 100 in FIG. 3). At this point among the processes, Pt and metal oxide such as IrO and RuO are used as materials of the bottom electrode 21. A layer or layers of barrier metal such as Ti and TiN may be used between bottom electrode 21 and substrate 20 to prevent mutual diffusion of dopants and increasing conjunction of the bottom electrode 21 with the substrate 20.

Next, SBT is deposited over the entire structure using physical vapor deposition (PVD) such as sputtering or chemical vapor deposition (CVD) such as metal-organic chemical vapor deposition (MOCVD). The deposited SBT thin film is crystallized by thermal treatment to form a polycrystalline thin film of SBT 22 to a thickness of about 50 to 300 nm (step 200). At this point, the polycrystalline thin film of SBT 22 is in the state of the composition of $Sr_xBi_yTa_2O_9$ (here, X=0.6~1.0, and y=1.0~1.5) in which the composition ratio of relative volatile Bi is high.

Subsequently, an amorphous thin film of SBT 23 is deposited to a thickness of about 30 to 50 nm on the polycrystalline SBT thin film 22 using sol-gel method or chemical vapor deposition such as metal-organic chemical vapor deposition at a low temperature in a range between room temperature and 300° C. (step 300). At this point, the method of chemical vapor deposition is used for preventing the damage of the polycrystalline film of SBT 22 at the time of deposition of the amorphous film of SBT 23. The amorphous film of SBT 23 is also not crystallized because the deposition is performed at a low temperature below 300° C. In consideration of the evaporation of Bi in the post-process and the complement of Bi in the polycrystalline thin film of SBT 22, preferably, the polycrystalline thin film of SBT 22 is in the state of the composition of $Sr_xBi_yTa_2O_9$ (here, X=0.6~1.0, and y=1.2~2.0) in which the composition ratio of relative volatile Bi is high.

Next, an upper electrode 24 is formed on the second thin film of SBT 23. After this, the process of thermal treatment is performed for stabilizing the properties of the capacitor 25. The processes of photoresist and etching are then performed to design capacitor. At this point, the material of the upper electrode 24 may be the same as the bottom electrode 21. A layer of the other material may be used as a buffer layer, if required, for decreasing interaction between the second SBT thin film 23 and the upper electrode 24. After etching, performing thermal treatment can also enhance the capacitor properties decreased at the etching process.

While the present invention has been described with respect to certain preferred embodiments only, other modifications and variations may be made without departing from the spirit and scope of the present invention as set forth in the following claims.

What is claimed is:

1. A method for fabricating a ferroelectric capacitor which comprises the steps of:
   forming a bottom electrode over a substrate on which a predetermined lower structure is formed;
   forming a polycrystalline thin film of strontium bismuth tantalate (SBT) over the entire structure;
   forming an amorphous thin film of SBT on the polycrystalline thin film of SBT; and
   forming an upper electrode on the amorphous thin film of SBT.

2. The method according to claim 1, wherein forming the polycrystalline film of SBT comprises the steps of:
   depositing a polycrystalline thin film of SBT; and
   performing thermal treatment for crystallization of the polycrystalline film of SBT.

3. The method according to claim 2, wherein the amorphous thin film of SBT is formed by sol-gel method or metal-organic chemical vapor deposition.

4. The method according to claim 2, wherein the thickness of the polycrystalline thin film of SBT is 50 to 300 nm.

5. The method according to claim 2, wherein the polycrystalline thin film of SBT is in the state of the composition of $Sr_xBi_yTa_2O_9$, here x=0.6 to 1.0 and y=1.0 to 1.5.

6. The method according to claim 1, wherein the amorphous thin film of SBT is formed at a temperature in a range between room temperature and 300° C.

7. The method according to claim 6, wherein the amorphous thin film of SBT is in the state of the composition of $Sr_xBi_yTa_2O_9$, here x=0.6 to 1.0 and y=1.2 to 2.0.

8. The method according to claim 1, wherein the amorphous thin film of SBT is formed by sol-gel method or metal-organic chemical vapor deposition.

9. The method according to claim 1, wherein the thickness of the polycrystalline thin film of SBT is 50 to 300 nm.

10. The method according to claim 1, wherein the polycrystalline thin film of SBT is in the state of the composition of $Sr_xBi_yTa_2O_9$, here x=0.6 to 1.0 and y=1.0 to 1.5.

11. The method according to claim 1, wherein the amorphous thin film of SBT is in the state of the composition of $Sr_xBi_yTa_2O_9$, here x=0.6 to 1.0 and y=1.2 to 2.0.

* * * * *

UNITED STATES PATENT AND TRADEMARK OFFICE
CERTIFICATE OF CORRECTION

PATENT NO. : 6,190,924 B1
DATED : February 20, 2001
INVENTOR(S) : Lee

It is certified that error appears in the above-identified patent and that said Letters Patent is hereby corrected as shown below:

<u>Item [22],</u>
Filing date, please insert:
-- Item [30], Foreign Application Priorty Data, Dec. 30, 1997 (KR)............ 97 77897 --.

Signed and Sealed this

First Day of January, 2002

Attest:

Attesting Officer

JAMES E. ROGAN
*Director of the United States Patent and Trademark Office*